Sept. 11, 1956 A. A. BARCO 2,762,874

SEMI-CONDUCTOR SIGNAL AMPLIFIER CIRCUITS

Filed June 19, 1953

INVENTOR.

Allen A. Barco

BY H. L. Newton

ATTORNEY 2,762,874

SEMI-CONDUCTOR SIGNAL AMPLIFIER CIRCUITS

Allen A. Barco, Princeton, N. J., assignor to Radio Corporation of America, a corporation of Delaware Application June 19, 1953, Serial No. 362,862

9 Claims. (Cl. 179—171)

Figure 1:
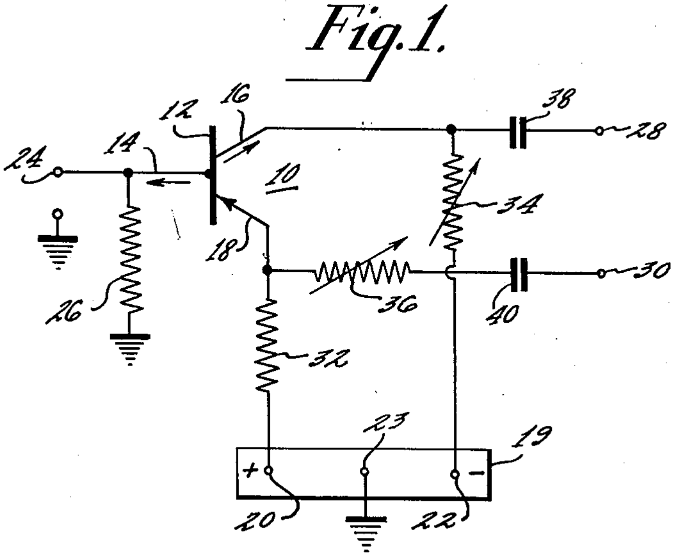

This invention relates in general to signal amplifier circuits for providing a pair of signals in phase opposition from a single ended signal source and particularly to balanced or push-pull amplifier circuits of that type utilizing semi-conductor devices.

The recent development of commercially useful semi-conductor devices of the type employing a semi-conductive element having three contact electrodes has already had a decided effect upon and has caused the introduction of many new techniques in the electronic signal communication field. These devices, known extensively as "transistors," are small in size, especially when compared with the ordinary vacuum tube, require no heater power, are very durable, and consist of materials which appear to have a long useful life.

The junction transistor, as is well known, comprises, in general, a body of semi-conductive material having two zones of one conductivity type separated by a zone of the opposite conductivity type. Thus, the device may be of either the N–P–N or P–N–P type. If the transistor is of the P–N–P type, the emitter electrode is normally biased positively to be in a relatively conducting or forward direction and the collector electrode negatively to be in a relatively non-conducting direction, each with respect to the base electrode. For the N–P–N type these polarities are reversed.

For many electronic circuit applications, relatively large power output with low signal distortion is desired. Thus, for example, electron-discharge devices have been used heretofore in signal amplifying circuits of the push-pull or balanced type to achieve these results. In the conventional push-pull amplifier circuit utilizing electron tubes, one amplifier tube may predominantly amplify either the positive or negative portion of the signal and does not pass the other portion of the signal as well. The signal is also inverted in phase by a suitable driving source and applied to a second amplifier tube. The amplified inverted wave is then re-inverted and combined with the other amplified wave to produce, in amplified form, the original signal.

The balanced driving source for such amplifiers may, for example, be a push-pull input transformer which at best may give rise to distortion due to phase shift, saturation at low frequencies, or resonance effects at high frequencies. Alternatively the balanced driving source for such amplifiers may be an electron-discharge phase-inverter circuit. Phase-inverter circuits, like transformers, add to the cost, and the signal may be distorted by reason of the unavoidable variation of circuit elements and tubes or unbalance due to circuit layout.

The present invention utilizes transistors instead of electron-discharge tubes to overcome the above noted and other disadvantages inherent in known push-pull amplifier circuits. Transistors, which are current operated devices, have been used previously in push-pull circuits. Thus, for example, the driving source may be a transistor connected for base input, collector and emitter output operation, providing two oppositely phased currents for driving a pair of output transistors. In such a circuit, one limitation is the difficulty of obtaining balanced output currents from the transistor driving source.

It is accordingly an object of the present invention to provide an improved transistor amplifier circuit wherein two oppositely phased balanced output currents are obtainable.

It is another object of the present invention to provide an improved transistor amplifier circuit suitable for use as the driving source in a push-pull amplifier circuit wherein a pair of signals in phase opposition are provided from a single ended source.

In the conventional push-pull amplifier circuit utilizing a transistor as the driving source, transistors having substantially identical characteristics are required in the output stage to faithfully reproduce, in amplified form, the original signal. It is known, however, that individual transistors, although intended to have identical characteristics when manufactured, may differ from each other. Because of the non-uniform reproducibility of transistor characteristics, identical operational results are not always obtained when transistors are exchanged or replaced in a particular circuit arrangement.

It is, accordingly, still another object of the present invention to provide an improved push-pull transistor amplifier circuit which may easily be adjusted for balanced operation for different circuit components.

It is yet another object of the present invention to provide an improved push-pull amplifier circuit utilizing transistors wherein output transistors having substantially differing operating characteristics may be used effectively to provide a balanced output signal.

These and further objects of the present invention are achieved in general by providing unequal load impedances in the output circuits of a transistor amplifier. These impedances are supplemented by a series resistor in the emitter circuit to provide a balanced output condition. A transistor amplifier of this type may conveniently be used as the driving source in a push-pull amplifier circuit.

Figure 2:
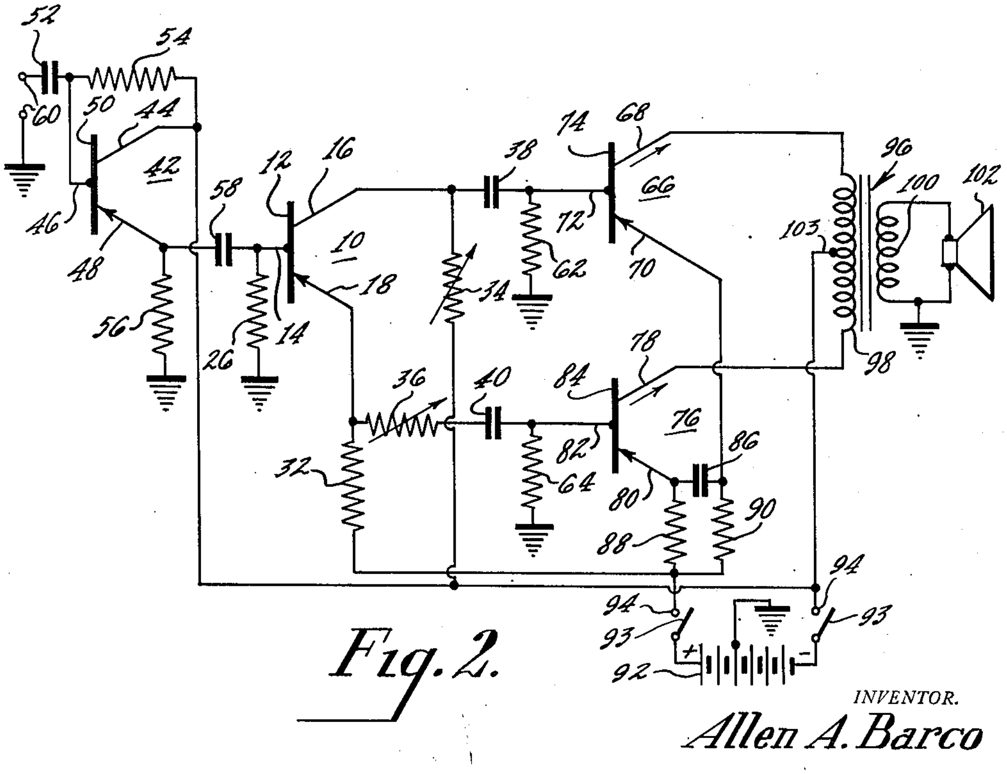

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a transistor amplifier connected for base input, collector and emitter output operation in accordance with the invention; and Figure 2 is a schematic circuit diagram of an audio frequency amplifier embodying the transistor illustrated in Figure 1 in accordance with the present invention.

Referring now to the drawings, wherein like elements are designated by like reference numerals in both figures, and referring particularly to Figure 1, a transistor 10 may be of the junction type, and in the drawings is illustrated as being, by way of example, of the P–N–P junction type. The transistor 10 consists of a semi-conductive body 12 having three contacting electrodes. Thus, the body 12 has a base electrode 14, a collector electrode 16, and an emitter electrode 18.

To properly bias the transistor, a source of voltage 19 may have a positive terminal 20, and a negative terminal 22. The base electrode 14 is connected through a suitable base resistor 26 to ground. While the source of voltage 19 will in most instances be a single battery having an intermediate point or terminal 23 grounded, two separate batteries may be used, and any source of unidirectional current such as rectified alternating current will be satisfactory. By poling the voltage source as shown, as is well known and understood, the emitter 18 will be biased in the current conducting or forward direction and the collector 16 in a non-coducting or reverse direction each with respect to the base electrode.

Load impedances for the emitter and collector electrodes respectively are provided by connecting a resistor 32 in series between the emitter 18 and the positive terminal of the source of biasing voltage, and a resistor 34 in series between the collector 16 and the negative terminal of the source of biasing voltage. A pair of signal output terminals 28, 30 are provided, the terminal 28 being connected through a coupling capacitor 38 to the emitter 16, and the terminal 30 being connected through a coupling capacitor 40 and a series resistor 36 to the collector 18. Thus, conductive alternating current signal output paths are provided for the emitter and collector, respectively. The purpose of the resistor 36 will be explained hereinafter.

A transistor of the type illustrated in Figure 1, connected for base input, collector and emitter output, may be used by way of example, as the driving source in a push-pull amplifier. Heretofore, when using a single transistor for this purpose, the load impedances in each of the output electrode circuits have been made equal. Thus, for example, the resistance of the collector load resistor 34 has been made equal to the resistance of the emitter load resistor 32 in the prior art circuits. In using a circuit of the type as a driving source for two identical transistor output stages, an unbalanced output condition has been observed. Accordingly, the signal currents which appear at the output terminals 28 and 30 are unequal in amplitude, and if these terminals are coupled respectively to the input electrodes of two push-pull transistors the signal appearing across the output circuit of these two transistors will be distorted. The apparent explanation for this unbalanced output condition is that the output impedances appearing across the collector and emitter electrodes of the transistors are unequal. This unbalanced condition is, of course, undesirable.

In accordance with the present invention, this unbalanced condition of the prior art circuits is corrected and substantially eliminated by placing unequal load impedances in the collector and emitter circuits respectively of the driver transistor and supplementing these by a series resistor in the emitter circuit. Thus in Figure 1, if the collector load resistor 34 is chosen to be somewhat smaller than the emitter load resistor 32, and a resistor 36 is connected in series between emitter 18 and the output terminal 30, a balanced output condition may be achieved. The effect of the smaller collector load resistor 34 is to lower the effective output impedance of the collector. Conversely, the effect of the series resistor 36 in the emitter circuit is to raise the effective output impedance of that circuit. Accordingly, by properly choosing the resistance value of each of these resistors relative to the emitter load resistor 32, the output currents which are coupled through the respective coupling capacitors 38, 40 to the output terminals 28, 30 can be made substantially equal and 180 degrees out-of-phase. It is apparent, therefore, that this circuit arrangement is ideally suited for operation as the phase-splitting driving source for a push-pull amplifier.

In the absence of a signal, direct-current will flow from the positive terminal 20 into the emitter 18, out the collector 16, through the load impedance 34 to the negative terminal 22 of the bias source. When an alternating current signal voltage is applied to the base 14 of the transistor 10, signal currents will appear at each of the terminals 28 and 30 respectively. These currents will be in phase opposition, and by virtue of the unequal load impedances and the resistor 36 in the emitter output path will be equal in amplitude, thus achieving a balanced output condition with a single-ended source.

In Figure 2, reference to which is now made, the circuit illustrated in Figure 1 has been embodied, by way of example, as the driving source, in a push-pull audio frequency amplifier circuit, which includes an input transistor 42, the driver transistor 10 and a push-pull stage which includes two transistors 66 and 76. The transistors are illustrated as being of the P–N–P junction type. It should be understood, however, that point-contact transistors of either the N or P type could be used, as well as N–P–N junction type by making appropriate changes of the circuit parameters. If P type point-contact transistors or N–P–N junction transistors are used, the polarity of the source of biasing voltage would be reversed.

To properly bias each of the amplifier stages a single battery 92 is provided which is connected through a pair of switches 93 to two terminals 94. Rather than providing two switches as shown, by way of example, it should be understood that a single switch of the double-pole single-throw type may be utilized. Biasing potentials for the input transistor 42 are obtained by connecting its base 46 through a relatively large resistor 54 to the negative terminal of the battery. Since the resistance of the resistor 54 is relatively large, the collector 44 will be more negative than the base 46 and will, accordingly, be biased in a non-conducting or reverse direction with respect to the base. The emitter 48 of the transistor 42 is connected through a load resistor 56 to ground. Thus, the emitter is biased in a relatively conducting or forward direction with respect to the base 46.

To couple the input transistor 42 to the driver transistor 10, a coupling capacitor 58 is connected from the junction of the emitter 48 and the load resistor 56 to the junction of a base resistor 26 and the base 14 of the driver transistor 10. The driver transistor 10 may be identical with the one illustrated in Figure 1 and has its emitter connected through a load resistor 32 to a positive source of biasing voltage, in this case the positive terminal of the biasing battery 92, and its collector 16 through a load resistor 34 to the negative terminal of the battery 92. Since the base electrode of this transistor is connected through the resistor 26 to ground, the emitter electrode is biased to be in the current conducting or forward direction and the collector 16 is biased in a non-conducting or reverse direction each with respect to the base 26.

To provide a conductive alternating current output path for the collector 16, a coupling or blocking capacitor 38 is connected from the junction of the collector and the collector load resistor 34 to the junction of a base resistor 62 and the base 72 of one of the push-pull output transistors 66. A signal conducting output path is provided between the emitter 18 and the other push-pull transistor 76 by connecting the resistor 36 from the junction of the emitter 18 and the emitter load resistor 32 to one plate of a coupling capacitor 40. The other plate of the capacitor 40 is connected to the junction of a base resistor 64 and the base 82 of the second push-pull transistor 76.

To insure balance in the push-pull output stage, each of the collector electrodes 68 and 78 of the two push-pull transistors 66 and 76 respectively, are connected directly to either end of the primary winding 98 of an output transformer, which has a center tap 103 connected with the negative terminal of the battery 92. Accordingly, the negative terminal of battery 92 is connected directly through an opposite half of the primary winding to each of the collectors 68 and 78. To bias the respective emitters 70, 80 of the output transistors 66, 76 in a forward direction with respect to their bases 72, 82, they are connected through respective biasing resistors 90 and 88 to the positive terminal of the battery 92. A single by-pass capacitor 86 by-passes the biasing resistors 88 and 90 for signal frequencies.

Output signals may be taken from across a secondary winding 100 of the output transformer 96. A suitable sound reproducing means or utilization device, such as a loud speaker 102, is connected with the secondary winding 100 of the output transformer.

The push-pull output transistors are operated Class A by virtue of their biasing arrangement. For Class A operation each of the emitter electrodes 70, 80 of the respective transistors 66, 76 is biased positively with respect to the respective base electrodes 72, 82. Consequently both transistors will be conducting in the absence of signal input. When signals are applied to the circuit at the input terminals 60, one of which is grounded and the other of which is coupled through a coupling capacitor 52 to the base 46 of the input transistor 42, amplified signals representative of the input signals are developed in the emitter circuit of this transistor. These amplified signals are coupled through the series coupling capacitor 58 to the base 14 of the driver transistor 10.

By virtue of the unequal load impedances 34 and 32 in the collector and emitter circuits respectively, and the inclusion of series resistor 36 in the emitter output path, as provided by the present invention, the signal currents which are coupled through the capacitors 38, 40 to the base of each of the transistors in the push-pull stage will be equal and 180 degrees out-of-phase. Amplified balanced currents will then flow in the collector electrodes 68, 78 of each of these amplifiers. These currents are combined in the primary winding 98 of the output transformer and the resultant output signal is an amplified version of the input signal.

The present invention also provides a circuit which may be easily adjusted for different circuit components. In the ideal case the push-pull transistors 66, 76 would have identical characteristics. Transistors, however, although intended to have identical characteristics when manufactured, may very often differ from each other. Since, therefore, as a practical matter, two identical transistors are not always available for the push-pull stage, it may be advantageous to make the resistors 34, 36 variable as shown. In this manner the circuit may be adjusted for the different characteristics of the push-pull transistors to achieve two balanced output currents for this stage and insure faithful reproduction of the input signal.

A practical circuit of the type illustrated in Figure 2 has been constructed and tested using four transistors of the type known commercially as RCA type TA-153. While it will be understood that the circuit specifications may vary according to the design for any particular application, the following circuit specifications were used in one practical circuit and are included by way of example only:

| | |
|---|---|
| Capacitors **52, 58, 38, 40** and **86** | .02, 4, 10, 10 and 25 microfarads, respectively. |
| Resistors **54** and **56** | 1 megohm and 10,000 ohms, respectively. |
| Resistors **26, 32, 34** and **36** | 10,000, 1500, 820 and 560 ohms respectively. |
| Resistors **62** and **64** | 1500 ohms each. |
| Resistors **88** and **90** | 470 ohms each. |

As described herein, a transistor amplifier is easily and effectively connected and adjusted for a balanced output condition, thus permitting its use as the driving source for a push-pull amplifier for obtaining signal amplification with a minimum of distortion. The circuit is not only simple and reliable, but may be easily adjusted for different circuit components.

What is claimed is:

1. A semi-conductor circuit having terminals and circuit connections therewith for providing a pair of output signal currents substantially equal in amplitude and opposite in phase comprising in combination, a semi-conductor device having a base, an emitter, and a collector electrode, means coupled to said base electrode for applying input signals to said circuit, a first impedance element having resistance connected to said collector electrode, a second impedance element having resistance connected to said emitter electrode, said second impedance element having resistance larger than the impedance of said first impedance element to effect substantially balanced output signals, an output circuit coupling said collector and emitter electrodes with said terminals, and a third impedance element connected from the junction of said emitter electrode and said second impedance element to one of said terminals thereby to be traversed by the output signal current from said emitter electrode, said third impedance element having resistance of a magnitude to further modify the output signal therefrom into complete balance with the signal from the collector electrode.

2. A semi-conductor amplifier circuit comprising a pair of substantially identical semi-conductor devices each having at least an input and an output electrode, a phase inverting semi-conductor device having an input electrode and a first and second output electrode, a first load impedance element coupled with said first output electrode of said phase inverting device, a second load impedance element coupled with said second output electrode of said phase inverting device, the impedance of said second element being greater than the impedance of said first element, means including a resistor having resistance of a magnitude to provide balanced output signals from the first and second output electrodes of said phase inverting device connected from a point between said second output electrode of said phase-inverting device and said second load impedance element to the input electrode of one of said pair of semi-conductor devices and adapted to be traversed by the output signal current from said second output electrode, and means connecting said first output electrode of said phase inverting device with the input electrode of the other of said pair of said semi-conductor devices and adapted to be traversed by the output signal current from said first output electrode, whereby said output signal currents from said first and second output electrodes are applied simultaneously to each of the input electrodes of said pair of semi-conductor devices in substantially equal and out-of-phase relation.

3. In combination with a semi-conductor signal amplifying device having a semi-conductive body, an input electrode and a first and second output electrode in contact therewith, means for biasing said electrodes for amplifier operation, a first load resistor coupled with said first output electrode, means providing a conductive signal output path for said first output electrode, a second load resistor coupled with said second output electrode, and a further resistor connected from a point between said second output electrode and said second load resistor and adapted to be traversed by the output signal current from said second output electrode, the resistance of said first load resistor being smaller than the resistance of said second load resistor to provide substantially balanced output signals from said device.

4. A semi-conductor signal amplifier circuit comprising a pair of substantially identical semi-conductor devices each having at least an input and an output electrode, a phase inverting semi-conductor device having a base, an emitter, and a collector electrode, a first load resistor coupled with said collector electrode of said phase inverting device, a second load resistor coupled with said emitter electrode of said phase inverting device, the resistance of said second resistor being greater than the resistance of said first resistor, means including a third resistor coupling said emitter electrode of said phase-inverting device with the input electrode one of said pair of semi-conductor devices and adapted to be traversed by the output signal current from said emitter electrode, and means connecting said collector electrode of said phase inverting device with the input electrode of the other of said pair of semi-conductor devices and adapted to be traversed by the output signal current from said collector electrode, whereby said output signal currents from said emitter and collector electrodes are applied simultaneously to each of the input electrodes of said pair of semi-conductor devices in substantially equal and out-of-phase relation.

5. A push-pull signal amplifier circuit comprising in combination, a first semi-conductor device including a first semi-conductive body, an input electrode, and a first and second output electrodes each in contact with said first semi-conductive body, a second semi-conductor device including a second semi-conductive body, and at least an input and output electrode each in contact with said second semi-conductive body, a third semi-conductor device including a third semi-conductive body and at least an input and output electrode each in contact with said third semi-conductive body, means for biasing said electrodes for amplifier operation, a first load impedance element connected with said first output electrode of said first device, means connecting said first output electrode of said first device with the input electrode of said second device and adapted to be traversed by the output signal current from said first output electrode, a second load impedance element connected with said second output electrode of said first device, means including a resistor having resistance of a magnitude to provide balanced output signals from said first and second output electrodes coupling said second output electrode with the input electrode of said third device and adapted to be traversed by the output signal current from said second output electrode, said second impedance element having an impedance which is larger than the impedance of said first impedance element, whereby said output signal currents from said first and second output electrodes are applied respectively to the input electrodes of said second and third device in substantially equal and out-of-phase relation, and a utilization circuit connected between the output electrodes of said second and third device.

6. In combination with a semi-conductor device having a semi-conductive body, a base electrode, an emitter electrode, and a collector electrode in contact therewith, means for biasing said electrodes for amplifier operation, load means including a first impedance element connected with said collector electrode and a second impedance element connected with said emitter electrode, the impedance of said first impedance element being smaller than the impedance of said second impedance element to effect substantially balanced and out-of-phase output signals, means providing a first conductive alternating current signal output path for said collector electrode, and means providing a second conductive alternating current signal output path including a series resistor connected from a point between said emitter electrode and said second impedance element, said series resistor further modifying the output signal from said emitter electrode into balance with the signal from the collector electrode.

7. In combination with a semi-conductor signal amplifying device having a semi-conductive body, a base, an emitter and a collector electrode in contact therewith, means including a source of potential for biasing said collector electrode in a relatively non-conducting polarity with respect to said base electrode and for biasing said emitter electrode in a relatively conducting polarity with respect to said base electrode, a first load resistor coupled with said collector electrode, means providing a conductive signal output path for said collector electrode, a second load resistor coupled with said emitter electrode, and a further resistor connected from a point between said emitter electrode and said second load resistor and adapted to be traversed by the output signal current from said emitter electrode, the resistance of said first load resistor being smaller than the resistance of said second load resistor, thereby providing substantially balanced output signals from said device.

8. A push-pull signal amplifier circuit comprising in combination, a first semi-conductor device including a first semi-conductive body, and a base, a collector and an emitter electrode each in contact with said first semi-conductive body, a second semi-conductor device including a second semi-conductive body, and a base, a collector and an emitter electrode each in contact with said second semi-conductive body, a third semi-conductor device including a third semi-conductive body and a base, a collector and an emitter electrode each in contact with said third semi-conductive body, means including a source of potential for biasing each of the collector and respective base electrodes in a relatively non-conducting polarity and each of the emitter and respective base electrodes in a relatively conducting polarity, a first load resistor connected with the collector electrode of said first device, means connecting the collector electrode of said first device with the base electrode of said second device and adapted to be traversed by the output signal current from the collector electrode of said first device, a second load resistor connected with the emitter electrode of said first device, means including a third resistor coupling the emitter electrode of said first device with the base electrode of said third device and adapted to be traversed by the output signal current from the emitter electrode of said second device, said second resistor having a resistance which is larger than the resistance of said first resistor whereby said output signal currents from the collector and emitter electrodes of said first device are applied to the respective base electrodes of said second and third devices in substantially equal and out-of-phase relation, and a utilization circuit connected between the collector electrode of said second and third device.

9. A semi-conductor amplifier circuit comprising in combination, a semi-conductor device having a base, an emitter, and a collector electrode, output terminals for said device, energizing means for biasing said electrodes for amplifier operation, a first load resistor coupled with said collector electrode, a second load resistor larger than said first load resistor coupled with said emitter electrode, means providing a first conductive signal output path coupled between said collector electrode and one of said output terminals, and means providing a second conductive signal output path including a series resistor coupled from the junction of said emitter electrode and said second load resistor to another of said output terminals.

References Cited in the file of this patent

UNITED STATES PATENTS

| | | |
|---|---|---|
| 2,517,960 | Barney et al. | Aug. 8, 1950 |
| 2,531,076 | Moore | Nov. 21, 1950 |
| 2,533,001 | Eberhard | Dec. 5, 1950 |
| 2,647,957 | Mallinckrodt | Aug. 4, 1953 |
| 2,666,817 | Raisbeck et al. | Jan. 19, 1954 |

OTHER REFERENCES

Barton, abstract of Serial No. 68,248, pub. October 5, 1952.